US010770984B2

(12) United States Patent
Ito

(10) Patent No.: US 10,770,984 B2
(45) Date of Patent: Sep. 8, 2020

(54) SWITCHING CONTROL DEVICE WITH REVERSE BIAS CIRCUIT

(71) Applicant: YAZAKI CORPORATION, Tokyo (JP)

(72) Inventor: Satoshi Ito, Shizuoka (JP)

(73) Assignee: YAZAKI CORPORATION, Tokyo (JP)

(*) Notice: Subject to any disclaimer, the term of this patent is extended or adjusted under 35 U.S.C. 154(b) by 0 days.

(21) Appl. No.: 16/546,182

(22) Filed: Aug. 20, 2019

(65) Prior Publication Data
US 2019/0372467 A1 Dec. 5, 2019

Related U.S. Application Data

(63) Continuation of application No. PCT/JP2017/043875, filed on Dec. 6, 2017.

(30) Foreign Application Priority Data

Mar. 21, 2017 (JP) ................. 2017-054649

(51) Int. Cl.
H02M 1/08 (2006.01)
H02M 1/088 (2006.01)
(Continued)

(52) U.S. Cl.
CPC .. H02M 3/33592 (2013.01); H03K 17/04163 (2013.01)

(58) Field of Classification Search
CPC ...... H03K 17/04106; H03K 17/04123; H02M 1/08; H02M 1/088; H02M 3/33592
See application file for complete search history.

(56) References Cited

U.S. PATENT DOCUMENTS 5,010,261 A * 4/1991 Steigerwald ..... H03K 17/04123
327/404
5,264,736 A * 11/1993 Jacobson ................ H02M 1/38
327/100
(Continued)

FOREIGN PATENT DOCUMENTS

JP 4-94825 U 8/1992
JP 6-37614 A 2/1994
(Continued)

OTHER PUBLICATIONS

Machine English Translation of JP,06-276724 (Year: 1994).*
(Continued)

Primary Examiner — Thienvu V Tran
Assistant Examiner — Sisay G Tiku
(74) Attorney, Agent, or Firm — Kenealy Vaidya LLP

(57) ABSTRACT

A drive circuit is connected to a gate terminal of an FET connected to a DC power supply to be transformed and controlled to be turned on or off, and applies a voltage to the gate terminal to turn on the FET, the FET including a drain terminal to which a current is input, a source terminal that outputs the current input from the drain terminal, and the gate terminal that controls the current flowing from the drain terminal to the source terminal. A reverse bias circuit includes a capacitor connected to the source terminal of the FET, and a coil having one end connected between the drive circuit and the gate terminal and the other end connected between the capacitor and the source terminal.

1 Claim, 4 Drawing Sheets

(51) Int. Cl.
*H02M 3/335* (2006.01)
*H03K 17/041* (2006.01)
*H03K 17/0412* (2006.01)
*H03K 17/0416* (2006.01)

(56) References Cited

U.S. PATENT DOCUMENTS

| | | | | |
|---|---|---|---|---|
| 5,276,357 | A * | 1/1994 | Cripe | H03K 17/04163 327/109 |
| 6,016,259 | A * | 1/2000 | Tamura | H02M 3/338 363/131 |
| 6,570,777 | B1 * | 5/2003 | Bennett | H03K 17/04163 363/21.02 |
| 6,677,828 | B1 * | 1/2004 | Harnett | H01J 37/32082 315/111.21 |
| 8,760,223 | B2 * | 6/2014 | Fujikawa | H03K 17/04123 327/382 |
| 10,187,051 | B2 * | 1/2019 | Kondapalli | H01F 29/14 |
| 10,250,249 | B1 * | 4/2019 | Feno | H03K 17/04123 |
| 2003/0062930 | A1 * | 4/2003 | Li | H03K 17/04123 327/108 |
| 2005/0001659 | A1 * | 1/2005 | Inoshita | H02M 1/08 327/108 |
| 2006/0170043 | A1 * | 8/2006 | Liu | H02M 1/08 257/341 |
| 2013/0009672 | A1 * | 1/2013 | Olivo | H03K 17/163 327/109 |
| 2015/0188534 | A1 * | 7/2015 | Yonezawa | H03K 17/04163 327/384 |

FOREIGN PATENT DOCUMENTS

| | | | |
|---|---|---|---|
| JP | 06-276724 | * | 6/1994 |
| JP | 6-276724 A | | 9/1994 |
| JP | 7-16592 U | | 3/1995 |
| JP | 2008-67475 A | | 3/2008 |

OTHER PUBLICATIONS

International Search Report and Written Opinion of the International Search Report for PCT/JP2017/043875 dated Jan. 9, 2018.

* cited by examiner

SWITCHING CONTROL DEVICE WITH REVERSE BIAS CIRCUIT

CROSS-REFERENCE TO RELATED APPLICATION

This application is a continuation application of International Application No. PCT/JP2017/043875 filed on Dec. 6, 2017 which claims the benefit of priority from Japanese Patent Application No. 2017-054649 filed on Mar. 21, 2017 and designating the U.S., the entire contents of which are incorporated herein by reference.

BACKGROUND OF THE INVENTION

1. Field of the Invention

The present invention relates to a switching control device.

2. Description of the Related Art

Conventionally, for example, a DC/DC converter includes a switching circuit that converts DC power to AC power, a transformer that transforms the AC power converted by the switching circuit, and a rectifier circuit that rectifies the AC power transformed by the transformer to DC power, and a switching control device that controls the switching circuit. The switching control device performs a conversion into a predetermined AC power, for example, by performing an ON/OFF control of a switching element of the switching circuit (see Japanese Patent Application Laid-open No. 2008-67475).

By the way, the conventional switching control device may include a reverse bias circuit that applies a reverse bias voltage to the switching element of the switching circuit to quickly turn off the switching element, but the number of components constituting the reverse bias circuit tends to increase, and there is room for further improvement in this respect.

SUMMARY OF THE INVENTION

The present invention has been made in view of the above problem, and an object of the present invention is to provide a switching control device capable of suppressing an increase in the number of components constituting the reverse bias circuit.

In order to solve the above mentioned problem and achieve the object, a switching control device according to one aspect of the present invention includes a drive circuit that is connected to a control terminal of a switching element connected to a DC power supply to be transformed and controlled to be turned on or off, and applies a voltage to the control terminal to turn on the switching element, the switching element including an input terminal to which a current is input, an output terminal that outputs the current input from the input terminal, and the control terminal that controls the current flowing from the input terminal to the output terminal; and a reverse bias circuit that includes a capacitor connected to the output terminal, and a coil having one end connected between the drive circuit and the control terminal and the other end connected between the capacitor and the output terminal, wherein the coil has an inductance value capable of continuously outputting a reverse bias voltage by the reverse bias circuit.

According to another aspect of the present invention, in the switching control device, when an inductance value of the coil is L, a voltage applied to the drive circuit is VCC2, an ON period per cycle during which the voltage is applied to the control terminal by the drive circuit is Ton, an OFF period per cycle during which the voltage is not applied to the control terminal by the drive circuit is Toff, and a current value of the control terminal applied by the drive circuit is IG, it is preferable that the following equation (1) is satisfied:

$$L > (VCC2 \times Ton' Toff)/(2 \times IG \times (Ton+Toff)) \quad (1).$$

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

A mode (embodiment) for carrying out the present invention will be described in detail with reference to the drawings. The present invention is not limited by the contents described in the following embodiments. Further, the components described below include those which can be easily conceived by those skilled in the art and those which are substantially the same. Further, the configurations described below can be combined as appropriate. In addition, various omissions, substitutions, or modifications of the configuration can be made without departing from the scope of the present invention.

Embodiments

Figure 1:
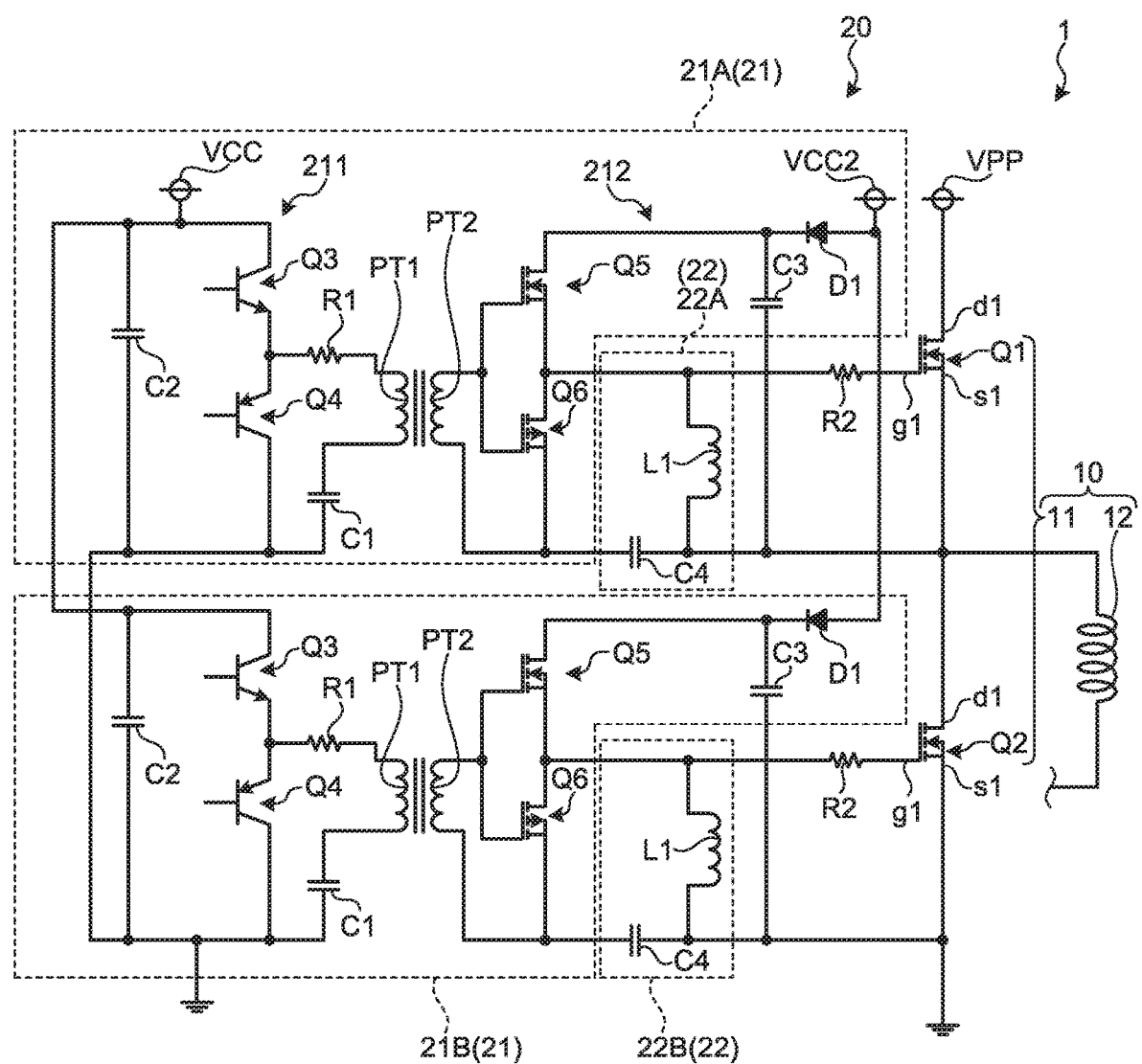
FIG. 1 is a circuit diagram illustrating a configuration example of a switching control device according to an embodiment.

A DC/DC converter 1 according to the embodiment will be described. As illustrated in FIG. 1, the DC/DC converter 1 is, for example, an isolated switching power supply. The DC/DC converter 1 transforms a voltage of DC power supplied from a DC power supply (battery) of a vehicle, for example. The DC/DC converter 1 includes a primary circuit 10, a secondary circuit (not illustrated), and a switching control device 20 that controls the primary circuit 10. The primary circuit 10 includes a switching circuit 11 and a primary winding 12 connected to the switching circuit 11. The switching circuit 11 is a circuit which is connected to the DC power supply VPP to be transformed and converts the DC power supplied from the DC power supply VPP into AC power. Here, the DC power supply VPP is a relatively high voltage, for example, a voltage of about 100 V to 200 V. The switching circuit 11 is, for example, a full bridge circuit configured by four switching elements. In FIG. 1, two switching elements Q1 and Q2 are illustrated in a switching circuit 11, and the remaining two switching elements are not illustrated. Each of the switching elements Q1 and Q2 is, for example, an N-channel type Metal-Oxide-Semiconductor Field-Effect Transistor (MOSFET), and hereinafter, also simply referred to as FETs Q1 and Q2. A drain terminal d1 as an input terminal of the FET Q1 is connected to the power supply VPP. A secondary circuit (not illustrated) includes a secondary wiring installed opposite to a primary winding 12, a rectifying circuit connected to the secondary wiring and rectifying the AC power output from the secondary wiring into DC power, and a smoothing circuit connected to the rectifying circuit and smoothing DC current output from the rectifying circuit. The DC/DC converter 1 converts DC power supplied from the DC power supply VPP into AC power by a switching circuit 11, transforms the converted AC power by the primary winding 12 and the secondary winding, rectifies the transformed AC power by the rectifying circuit, smooths the DC power rectified by the rectifying circuit by a smoothing circuit, and supplies the same to a load part.

A switching control device 20 is a device that controls four switching elements (FETs Q1, Q2, and the like) of a switching circuit 11. The switching control device 20 includes a drive circuit 21 and a reverse bias circuit 22 for each switching element. For example, the switching control device 20 includes a drive circuit 21A that controls the FET Q1 of the switching circuit 11 and a reverse bias circuit 22A, and includes a drive circuit 21B that controls the FET Q2 of the switching circuit 11 and a reverse bias circuit 22B. Since the four drive circuits 21 have the same configuration, the drive circuits 21A and 21B for respectively driving the FETs Q1 and Q2 of the switching circuit 11 are illustrated, and the drive circuits 21 for controlling the remaining two switching elements of the switching circuit 11 are not illustrated. Similarly, since the four reverse bias circuits 22 have the same configuration, reverse bias circuits 22A and 22B for respectively applying reverse bias voltages to the FETs Q1 and Q2 of the switching circuit 11 are illustrated, and the reverse bias circuits 22 for controlling the remaining two switching elements of the switching circuit 11 are not illustrated. Since a configuration and an operation of the drive circuit 21A for driving the FET Q1 are the same as those of the drive circuit 21B for driving the FET Q2 in the switching control device 20, the drive circuit 21A will be described in detail, and the description of the drive circuit 21B will be omitted in the following description. Further, since a configuration and an operation of the reverse bias circuit 22A applying the reverse bias voltage to the FET Q1 are the same as those of the reverse bias circuit 22B applying the reverse bias voltage to the FET Q2 in the switching control device 20, the reverse bias circuit 22A will be described in detail, and the description of the reverse bias circuit 22B will be omitted in the following description.

The drive circuit 21A is a circuit that controls the FET Q1 of the switching circuit 11 to be on or off. The drive circuit 21A includes a primary drive circuit 211 and a secondary drive circuit 212. The primary drive circuit 211 includes a power supply VCC of a low voltage (for example, about 12 V), an npn bipolar transistor Q3 (hereinafter, also simply referred to as a transistor Q3), and a pnp bipolar transistor Q4 (hereinafter, simply referred to as a transistor Q4), a primary winding PT1, a resistor R1, and capacitors C1 and C2. The transistor Q3 has a collector terminal connected to the power supply VCC, and an emitter terminal connected to an emitter terminal of the transistor Q4. A connection point of the transistor Q3 and the transistor Q4 is connected to one end of the primary winding PT1 via a resistor R1. The other end of the primary winding PT1 is connected to one end of the capacitor C1. The other end of the capacitor C1 and the collector terminal of the transistor Q4 are connected to the ground. A base terminal of the transistor Q3 and a base terminal of the transistor Q4 are connected to a pulse output circuit (not illustrated). The capacitor C2 is connected to the power supply VCC and stabilizes a power supplied from the power supply VCC. The primary drive circuit 211 performs an ON/OFF control of the transistors Q3 and Q4 based on a pulse signal output from a pulse output circuit, and outputs AC power (pulse signal) to the primary winding PT1. The secondary drive circuit 212 includes a secondary winding PT2, a power supply VCC2 of a low voltage (for example, about 12 V), a diode D1, an N-channel MOSFET Q5 (hereinafter, also simply referred to as an FET Q5), a P-channel MOSFET Q6 (hereinafter, also simply referred to as an FET Q6), and a capacitor C3. The primary winding PT1 and the secondary winding PT2 isolate the primary drive circuit 211 and the secondary drive circuit 212, and constitute a pulse transformer for generating a pulse signal. A gate terminal of the FET Q5 and a gate terminal of the FET Q6 are connected to one end of the secondary winding PT2. The FET Q5 has a drain terminal connected to the power supply VCC2 via the diode D1 and a source terminal connected to the drain terminal of the FET Q6. A connection point of the FET Q5 and the FET Q6 is connected to a gate terminal g1 as a control terminal of the FET Q1 via a resistor R2. A source terminal of the FET Q6 is connected between the other end of the secondary winding PT2 and a capacitor C4. The secondary drive circuit 212 performs an ON/OFF control of the FETs Q5 and Q6 based on an AC power (pulse signal) output via the secondary winding PT2 to apply a voltage to the gate terminal g1 of the FET Q1.

The reverse bias circuit 22A includes a capacitor C4 and a coil L1. The capacitor C4 has one end connected to a source terminal s1 as an output terminal of the FET Q1, and the other end connected to the other end of the secondary winding PT2. The coil L1 has one end connected between a source terminal of the FET Q5 and the gate terminal g1 of the FET Q1 and the other end connected between the capacitor C4 and the source terminal s1 of the FET Q1.

In the reverse bias circuit 22A, energy is stored in the coil L1 when the FET Q5 is turned on and the FET Q6 is turned off. Further, when the FET Q5 is turned off and the FET Q6 is turned on, the reverse bias circuit 22A discharges the energy stored in the coil L1, and charges the capacitor C4 with the discharged energy. The reverse bias circuit 22A applies a voltage to the source terminal s1 of the FET Q1 by the energy charged in the capacitor C4 to turns the FET Q1 into a reverse bias state.

The coil L1 preferably has an inductance value by which a continuous mode can be realized in which a reverse bias voltage is continuously output when the FET Q1 is turned off. Therefore, in order to realize the continuous mode, the coil L1 preferably has an inductance value that satisfies the following equation (1). That is, when the inductance value of the coil L1 is L, the voltage applied to the drive circuit 21A is VCC2, and an ON period per cycle when a voltage is applied to the gate terminal g1 by the drive circuit 21A is Ton, an OFF period per cycle when no voltage is applied to the gate terminal g1 by the drive circuit 21A is Toff, and a current value of the gate terminal g1 is IG, the coil L1 satisfies the following equation (1):

$$L > (VCC2 \times Ton \times Toff)/(2 \times IG \times (Ton + Toff)) \qquad (1)$$

When the coil L1 does not satisfy the inductance value of the equation (1), it turns into an intermittent mode where the reverse bias voltage is intermittently output, but it is possible to apply the reverse bias voltage to the FET Q1 even in the intermittent mode.

Figure 2:
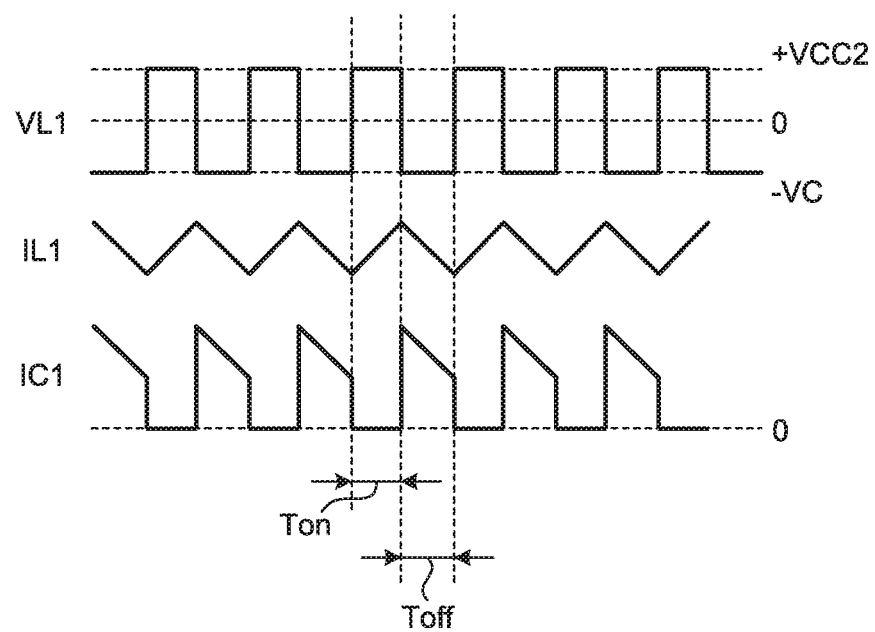
FIG. 2 is a diagram illustrating an operation example of the switching control device according to the embodiment.

Next, an example in which the switching control device 20 controls the FET Q1 will be described. As illustrated in FIG. 2, when the FET Q1 is turned on by the drive circuit 21A in the switching control device 20, an energy is stored in the coil L1 of the reverse bias circuit 22A (the period Ton). At this time, in the reverse bias circuit 22A, a voltage VL1 of the coil L1 becomes +VCC2, and a current IL1 flowing through the coil L1 increases. In this case, in the reverse bias circuit 22A, a current IC1 does not flow through the capacitor C4. Then, when the FET Q1 is turned off by the drive circuit 21A in the switching control device 20, the energy stored in the coil L1 of the reverse bias circuit 22A is discharged (the period Toff). At this time, in the reverse bias circuit 22A, the voltage VL1 of the coil L1 becomes −VC, the current IC1 flows through the capacitor C4, and the capacitor C4 is charged with energy. Then, the reverse bias circuit 22A turns the FET Q1 into a reverse bias state by the energy charged in the capacitor C4.

As described above, the switching control device 20 according to the embodiment includes the drive circuit 21 and the reverse bias circuit 22. For example, the drive circuit 21A, which is an FET Q1 connected to a DC power supply VPP to be transformed and controlled to be turned on or off, is connected to the gate terminal g1 of the FET Q1 having the drain terminal d1 to which a current is input, a source terminal s1 for outputting current input from the drain terminal d1, and the gate terminal g1 for controlling the current flowing from the drain terminal d1 to the source terminal s1, and applies the voltage to the gate terminal g1 to turn on the FET Q1. The reverse bias circuit 22A includes the capacitor C4 connected to the source terminal s1 of the FET Q1, and the coil L1 having one end connected between the drive circuit 21A and the gate terminal g1 and the other end connected between the capacitor C4 and the source terminal s1.

Thus, when the FET Q1 is turned on by applying the voltage to the gate terminal g1 of the FET Q1 by the drive circuit 21A, the switching control device 20 can store energy in the coil L1. Then, when the FET Q1 is turned off by the drive circuit 21A in the switching control device 20, the energy stored in the coil L1 of the reverse bias circuit 22A may be discharged, the capacitor C4 may be charged with the discharged energy, and a reverse bias voltage can be applied to the source terminal s1 of the FET Q1 by the energy charged in the capacitor C4. As a result, the switching control device 20 can eliminate at once carriers existing between the drain terminal d1 and the source terminal s1 of the FET Q1, quickly turning off the FET Q1. Further, in the switching control device 20, since the reverse bias circuit 22A can be configured with the coil L1 and the capacitor C4, the reverse bias circuit 22A can be configured with a relatively small number of components, and it is possible to suppress an increase in the number of the components constituting the reverse bias circuit 22A. As a result, the switching control device 20 can suppress the circuit from being enlarged and suppress a manufacturing cost.

Further, when the inductance value of the coil L1 is L, the voltage applied to the drive circuit 21A is VCC2, the ON period per period when the voltage is applied to the gate terminal g1 by the drive circuit 21A is Ton, the OFF period per cycle when no voltage is applied to the gate terminal g1 by the drive circuit 21A is Toff, and the current value of the gate terminal g1 is IG in the switching control device 20, the following equation (1) is satisfied:

$$L > (VCC2 \times Ton \times Toff)/(2 \times IG \times (Ton + Toff)) \qquad (1)$$

Thus, the switching control device 20 can realize a continuous mode in which the reverse bias voltage is continuously output when the FET Q1 is off, and apply the reverse bias voltage to the FET Q1 stably.

Modification

Figure 3:
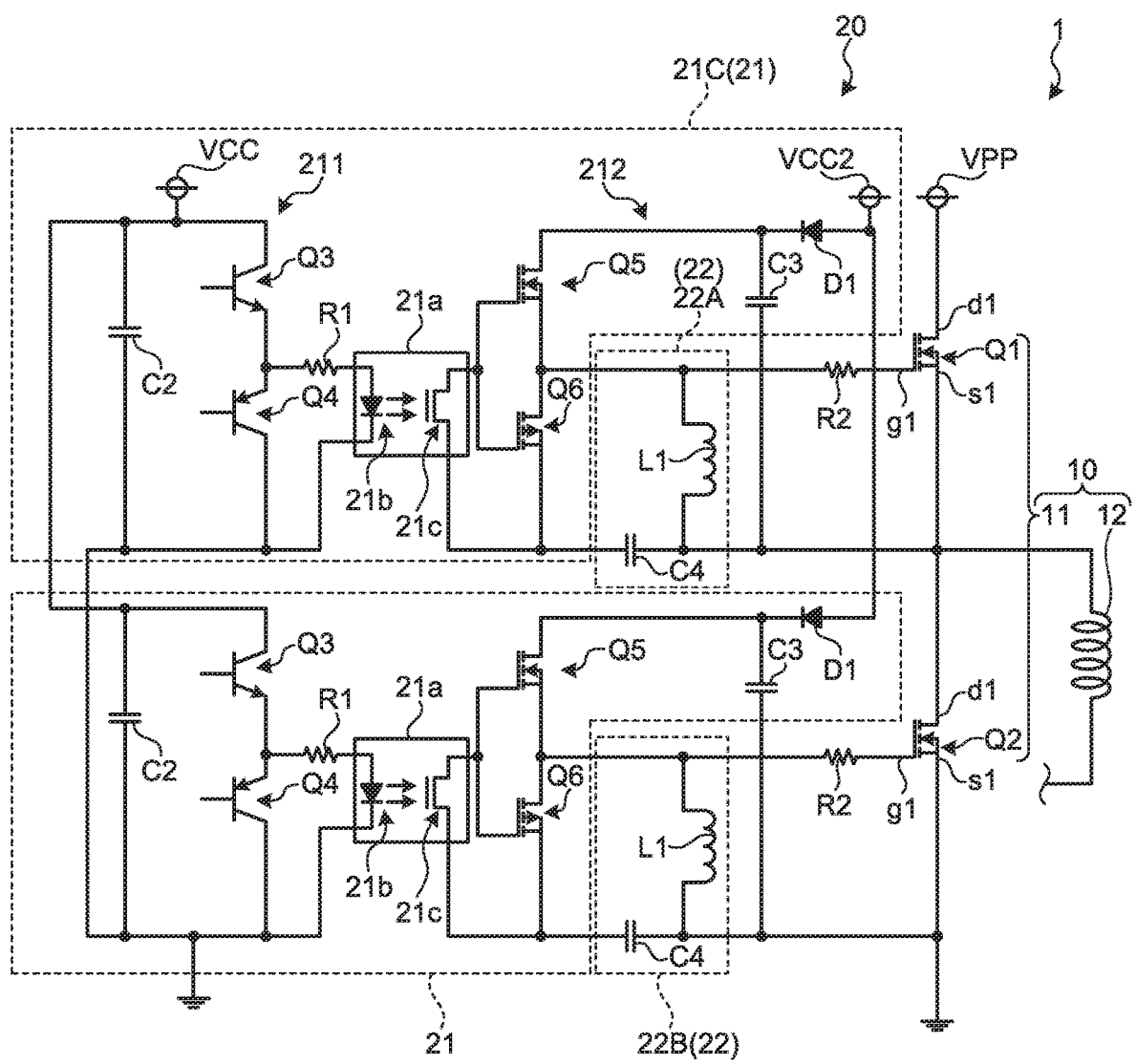
FIG. 3 is a circuit diagram illustrating a configuration example of a switching control device according to a modification.

Next, a modification of the embodiment will be described. Although an example in which the pulse transformer is configured with the primary winding PT1 and the secondary winding PT2 in the drive circuit 21A has been described, the embodiment is not limited thereto. For example, as illustrated in FIG. 3, the drive circuit 21A may use a photocoupler 21a instead of the pulse transformer. In this case, in a drive circuit 21C, the photocoupler 21a includes a light emitting element 21b and a light receiving element 21c. The light emitting element 21b is, for example, a light emitting diode, and has an anode terminal connected between a transistor Q3 and a transistor Q4 via a resistor R1 and a cathode terminal connected to the ground. The light receiving element 21c is, for example, a phototransistor, and has one end connected to a gate terminal of an FET Q5 and a gate terminal of an FET Q6 and the other end connected to the capacitor C4. In the drive circuit 21C, an optical signal is output from the light emitting element 21b when the current flows through the light emitting element 21b, and the optical signal output from the light emitting element 21b is received by the light receiving element 21c. Then, the drive circuit 21C converts the received light signal into an electric signal (pulse signal) and outputs it to the gate terminal of the FET Q5 and the gate terminal of the FET Q6 to perform an ON/OF control of the FETs Q5 and Q6. As described above, the drive circuit 21C may be configured to have the photocoupler 21a.

Figure 4:
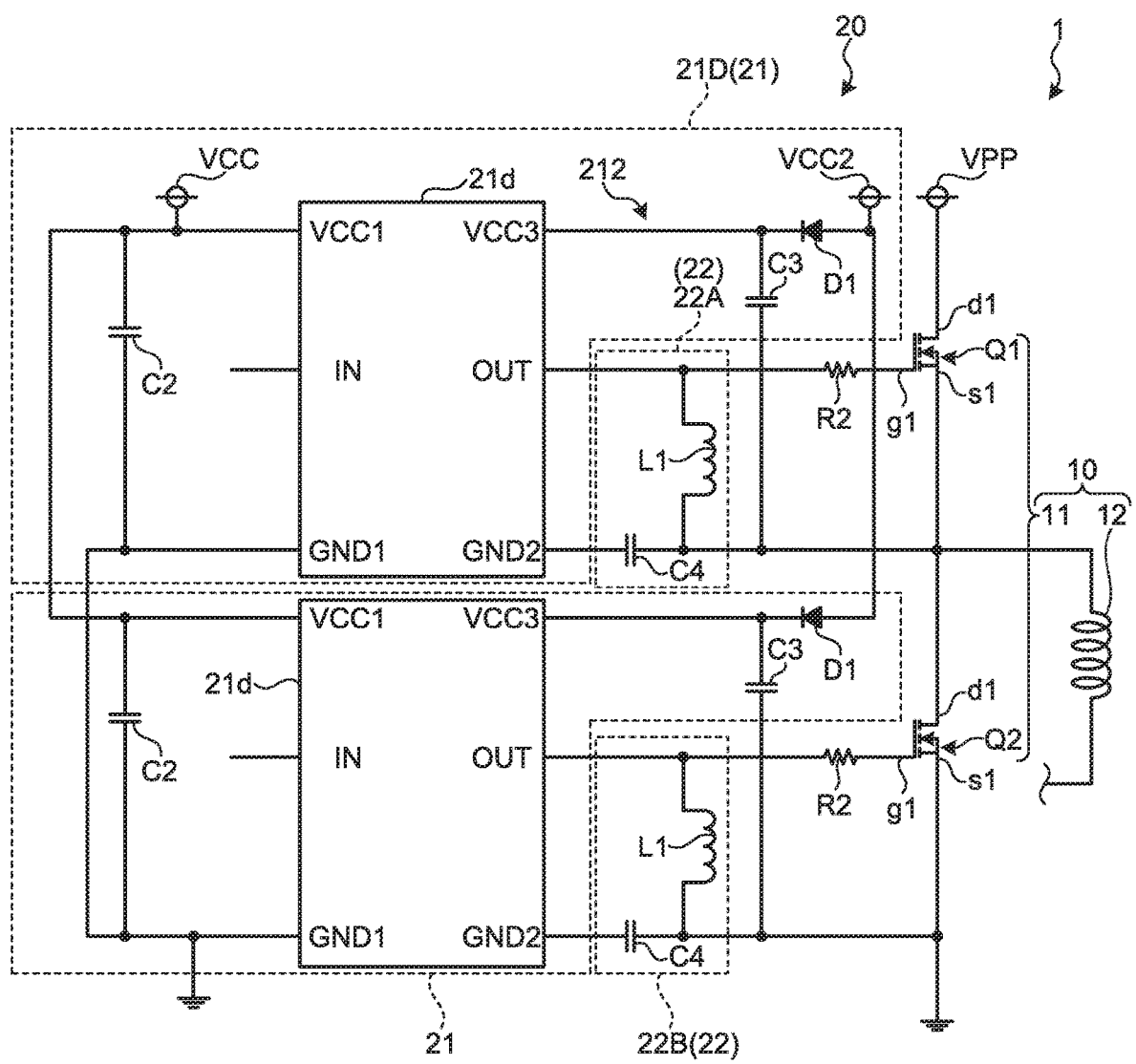
FIG. 4 is a circuit diagram illustrating a configuration example of a switching control device according to a modification.

Further, as illustrated in FIG. 4, the drive circuit 21 may be configured with an Integrated Circuit (IC) circuit 21d. In this case, a drive circuit 21D includes, as the IC circuit 21d on the primary side, an input terminal IN connected to the pulse output circuit, a power supply terminal VCC1 connected to a power supply VCC, and a ground terminal GND1 connected to the ground. Further, the drive circuit 21D includes, as an IC circuit 21d on the secondary side, an output terminal OUT connected to the gate terminal g1 of the FET Q1, a power supply terminal VCC3 connected to the power supply VCC2, and a ground terminal GND2 connected to the ground. In the drive circuit 21D, the input terminal IN and the output terminal OUT are isolated. When an ON signal is input from the pulse output circuit to the input terminal IN, the drive circuit 21D outputs an electrical signal that is applied to the gate terminal g1 of the FET Q1 from the output terminal OUT. Thus, the drive circuit 21D may be configured to have the IC circuit 21d.

Further, although an example in which each of the FETs Q1, Q2 and the like of the switching circuit 11 is the MOSFET has been described, it is not limited thereto. Each of the FETs Q1 and Q2, and the like may be, for example, a transistor such as a bipolar transistor.

Although the switching circuit 11 has been described as a full bridge system, it is not limited thereto, and may be a half bridge system, a push-pull system, or the like.

Further, although an example in which the DC/DC converter 1 is the isolated DC/DC converter has been described, it may be a non-isolated DC/DC converter.

A switching control device according to the present embodiment includes a reverse bias circuit including a capacitor connected to an output terminal of a switching element, and a coil having one end connected between a drive circuit and a control terminal of a switching element and the other end connected between the capacitor and an output terminal of the switching element. Thus, the switching control device can apply a reverse bias voltage to the output terminal of the switching element by the reverse bias circuit. Further, in the switching control device, since the reverse bias circuit can be configured by the coil and the capacitor, it is possible to suppress an increase in the number of components constituting the reverse bias circuit.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A switching control device comprising:
a drive circuit that is connected to a control terminal of a switching element connected to a DC power supply to be transformed and controlled to be turned on or off, and applies a voltage to the control terminal to turn on the switching element, the switching element including an input terminal to which a current is input, an output terminal that outputs the current input from the input terminal, and the control terminal that controls the current flowing from the input terminal to the output terminal; and
a reverse bias circuit that includes a capacitor connected to the output terminal, and a coil having one end connected between the drive circuit and the control terminal and another end connected between the capacitor and the output terminal, wherein
the coil has an inductance value capable of continuously outputting a reverse bias voltage by the reverse bias circuit, and
when an inductance value of the coil is L, a voltage applied to the drive circuit is VCC2, an ON period per cycle during which the voltage is applied to the control terminal by the drive circuit is Ton, an OFF period per cycle during which the voltage is not applied to the control terminal by the drive circuit is Toff, and a current value of the control terminal which is applied by the drive circuit and predetermined as a design value is IG, according to:

$$L > (VCC2 \times Ton \times Toff)/(2 \times IG \times (Ton + Toff)) \qquad (1).$$

* * * * *